(12) United States Patent
Huang et al.

(10) Patent No.: US 9,111,765 B2
(45) Date of Patent: Aug. 18, 2015

(54) INTEGRATED CIRCUIT (IC) STRUCTURE

(71) Applicant: Taiwan Semiconductor Manufacturing Company Limited, Hsin-Chu (TW)

(72) Inventors: Chi-Feng Huang, Zhubei (TW); Chia-Chung Chen, Hsin-Two (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 233 days.

(21) Appl. No.: 13/680,711

(22) Filed: Nov. 19, 2012

(65) Prior Publication Data

US 2014/0138749 A1    May 22, 2014

(51) Int. Cl.
*H01L 27/06* (2006.01)
*H01L 21/8248* (2006.01)
*H01L 27/12* (2006.01)

(52) U.S. Cl.
CPC ........ *H01L 27/0623* (2013.01); *H01L 21/8248* (2013.01); *H01L 27/1203* (2013.01)

(58) Field of Classification Search
CPC .................................................. H01L 21/824
USPC .......... 257/262, 581, 272, E27.014, 487, 270, 257/E21.696, E27.03; 330/277; 438/189, 438/190, 195
See application file for complete search history.

(56) References Cited

U.S. PATENT DOCUMENTS

| | | | | |
|---|---|---|---|---|
| 5,465,415 A * | 11/1995 | Bien | | 455/326 |
| 7,504,888 B1 * | 3/2009 | Ju et al. | | 330/301 |
| 8,115,280 B2 * | 2/2012 | Chen et al. | | 257/593 |
| 2009/0168508 A1 * | 7/2009 | Kapoor et al. | | 365/177 |
| 2010/0271133 A1 * | 10/2010 | Bracale et al. | | 330/277 |

OTHER PUBLICATIONS

Mikro-e, "Understanding Electronic Components," ch. 4 Transistors, 2003.*
Shi, et al., "A Cost-Competitive High Performance Junction-FET (JFET) in CMOS Process for RF & Analog Applications", 2010 IEEE Radio Frequency Integrated Circuits Symposium, 2010, pp. 237-240.

* cited by examiner

*Primary Examiner* — Mamadou Diallo
*Assistant Examiner* — Christina Sylvia
(74) *Attorney, Agent, or Firm* — Cooper Legal Group, LLC (57) ABSTRACT

One or more techniques or systems for forming an integrated circuit (IC) or associated IC structure are provided herein. In some embodiments, the IC includes a junction gate field effect transistor (JFET) and a lateral vertical bipolar junction transistor (LVBJT). For example, the JFET and the LVBJT are formed in a same region, such as a substrate. In some embodiments, the JFET and the LVBJT are at least one of adjacent or share one or more features. In this manner, a reliable IC is provided, thus enabling power amplification, for example.

20 Claims, 8 Drawing Sheets

INTEGRATED CIRCUIT (IC) STRUCTURE

BACKGROUND

Complementary metal-oxide semiconductor (CMOS) devices are sometimes used in radio-frequency (RF) power applications. Generally, transformer based amplification is associated with a large space requirement. However, issues related to reliability, circuits, patterns, etc. often arise.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques or systems for forming an integrated circuit (IC) or an associated IC structure are provided herein. For example, the IC or IC structure comprises a lateral vertical bipolar junction transistor (LVBJT) and a junction gate field effect transistor (JFET). In some embodiments, the IC or IC structure facilitates power amplification, such as complementary metal-oxide semiconductor (CMOS) power amplification. In some embodiments, the LVBJT and the JFET are implemented as separate components on a same region, such as a substrate, for example. In some embodiments, the IC or IC structure is used as a power amplifier (PA) solution for amplifying an input signal, for example. Accordingly, the IC or IC structure enables power amplification associated with at least one of higher gain, higher linearity, higher breakdown voltage, lower flicker noise based on a CMOS process, for example.

The following description and annexed drawings set forth certain illustrative aspects and implementations. These are indicative of but a few of the various ways in which one or more aspects are employed. Other aspects, advantages, or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Embodiments or examples, illustrated in the drawings are disclosed below using specific language. It will nevertheless be understood that the embodiments or examples are not intended to be limiting. Any alterations and modifications in the disclosed embodiments, and any further applications of the principles disclosed in this document are contemplated as would normally occur to one of ordinary skill in the pertinent art.

It will be appreciated that 'layer', as used herein, contemplates a region, and does not necessarily comprise a uniform thickness. For example, a layer is a region, such as an area comprising arbitrary boundaries. For another example, a layer is a region comprising at least some variation in thickness.

It will be appreciated that a first-type region is associated with at least one of a p-type or n-type doping. Similarly, a second-type region is associated with at least one of a p-type or n-type doping. Generally, the second-type is opposite of the first-type. Accordingly, when the first-type region is a p-type region, the second-type region is an n-type region and vice-versa. Accordingly, in some embodiments, the first-type is p-type and the second-type is n-type. In other embodiments, the first-type is n-type and the second-type is p-type.

As used herein, the "+" symbol or a plus region is indicative of strong doping associated with a conductivity type. For example, N+ is indicative of a strongly doped N type region. Conversely, the "−" symbol or a minus region is indicative of weak doping associated with a conductivity type. For example, P− is indicative of a weakly doped P type region.

Figure 7:
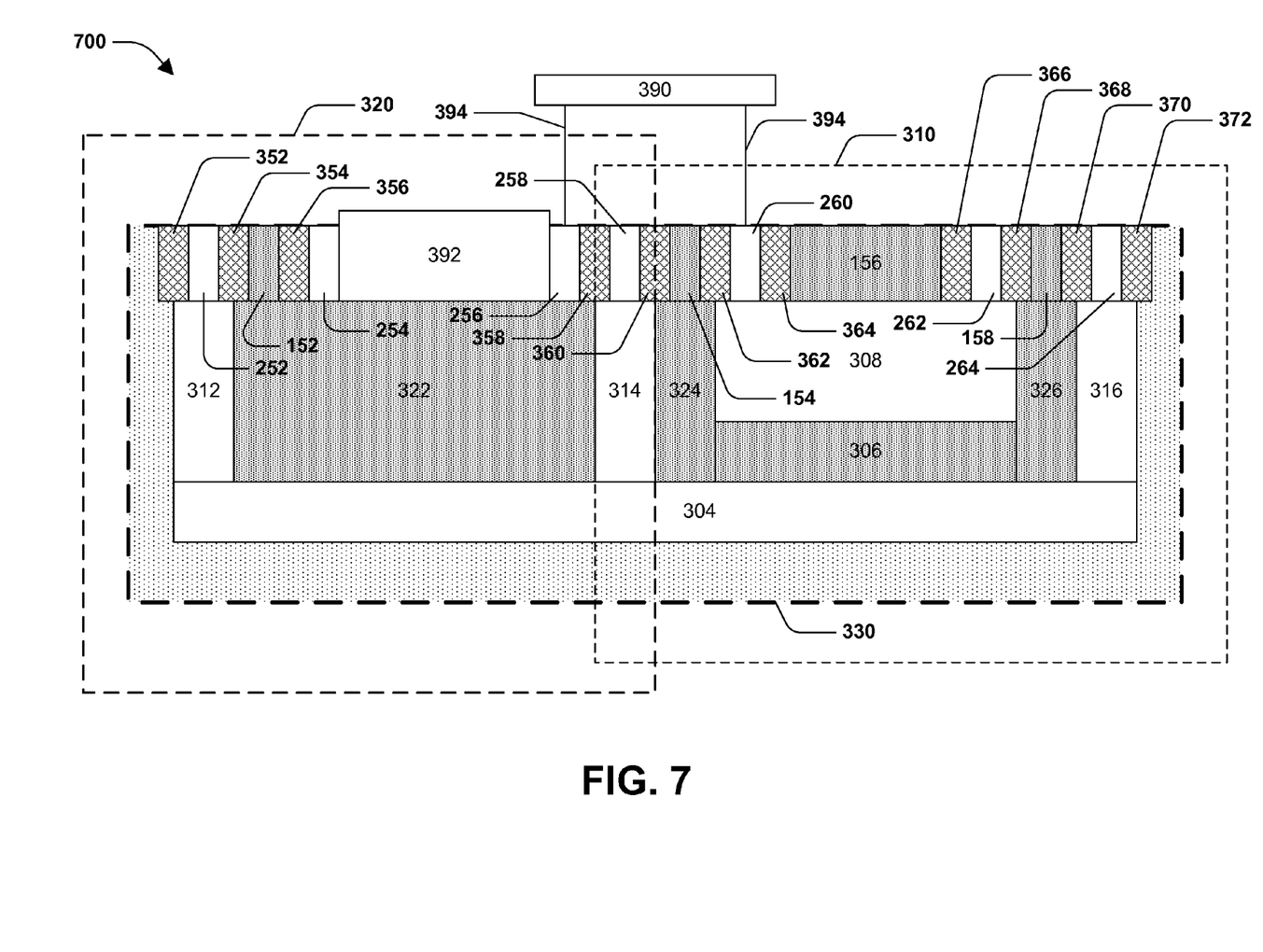
FIG. 7 is a cross-sectional view of an example integrated circuit (IC) structure during formation, according to some embodiments.

It will be appreciated that for at least some of the figures herein, one or more boundaries, such as boundaries 310 and 320 of FIG. 7, for example, are drawn with different heights, widths, perimeters, aspect ratios, etc. relative to one another merely for illustrative purposes, and are not necessarily drawn to scale. For example, because dashed or dotted lines are used to represent different boundaries, if the dashed and dotted lines were drawn on top of one another they would not be distinguishable in the figures, and thus are drawn slightly apart from one another, in at least some of the figures, so that they are distinguishable from one another, for example. As another example, because a component is associated with one or more features, a box drawn with a dashed line, dotted lined, etc. does not necessarily encompass an entire component. Similarly, a drawn box does not necessarily encompass merely the associated component, but encompasses at least some of one or more other components as well, in some embodiments. Accordingly, dimensions of some of these boundaries are drawn taller, shorter, wider, narrower, etc. than needed in some embodiments so that the different boundaries are visible in the figures, for example.

Figure 1:
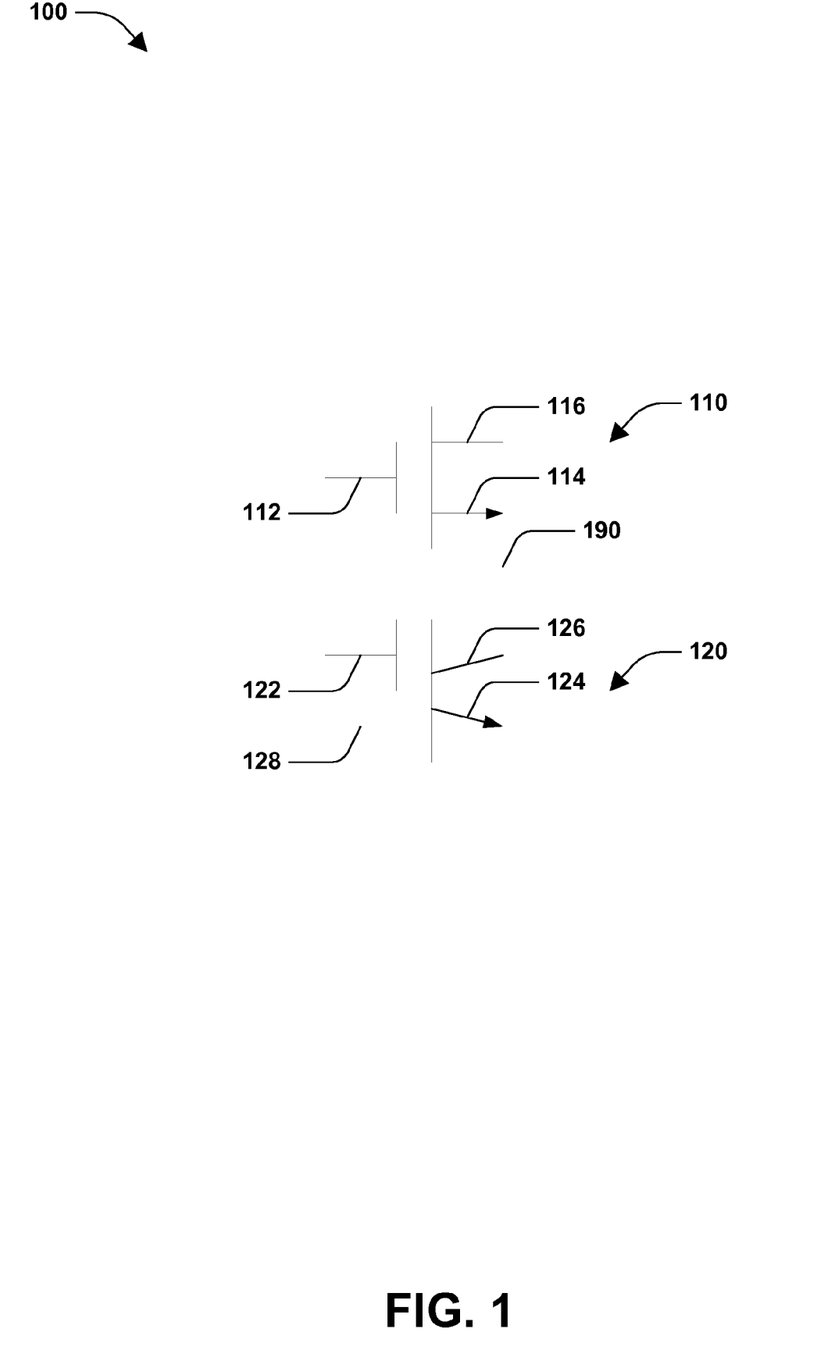
FIG. 1 is a schematic diagram of an example integrated circuit (IC), according to some embodiments.

FIG. 1 is a schematic diagram 100 of an example integrated circuit (IC), according to some embodiments. For example, the IC of FIG. 1 comprises a junction field effect transistor (JFET) 110 and a lateral vertical bipolar junction transistor (LVBJT) 120. In some embodiments, the JFET 110 comprises a JFET gate 112, a JFET drain 116, and a JFET source 114. In some embodiments, the LVBJT 120 comprises a LVBJT gate 122, a LVBJT base 128, a LVBJT emitter 124, and a LVBJT collector 126. It will be appreciated that at least one of the JFET 110 or the LVBJT 120 comprises one or more gates in some embodiments. For example, in some embodiments, the JFET 110 comprises a second JFET gate. In some embodiments, the JFET 110 comprises a top gate and a bottom gate. In some embodiments, the JFET gate 112 is a top gate of the JFET 110. Additionally, in some embodiments, the JFET gate 112 is connected to the LVBJT gate 122. In some embodiments, the top gate of the JFET 110 is connected to the LVBJT gate 122. In some embodiments, at least one of the JFET gates is connected to at least one of ground or a direct current (DC) bias source. For example, at least one of the JFET gate 112, the top gate of the JFET 110, or the bottom gate of the JFET 110 is connected to at least one of ground, the DC bias source, or the LVBJT gate 122. In some embodiments, the bottom gate of the JFET 110 is connected to the LVBJT gate 122. In some embodiments, the LVBJT 120 comprises a second LVBJT gate. In some embodiments, the IC is associated with at least one of a cascade or cascode configuration. For example, the LVBJT collector 126 is connected to or coupled to the JFET source 114 based on connection 190, according to some aspects. It will be appreciated that in some embodiments, the JFET 110 and the LVBJT 120 of FIG. 1 are formed at least one of on a same region, such as a substrate region or adjacent to one another. In some embodiments, the JFET 110 and LVBJT 120 are formed such that they share one or more features, components, or regions, for example. Additionally, in some embodiments, the JFET 110 is adjacent to the LVBJT 120 within a region, such as a first-type region or a substrate region, for example. In some embodiments, the JFET 110 is an n-channel JFET. It will be appreciated that in some embodiments, at least one of the gates of the JFET 110 is associated with a different width than at least one of the gates of the LVBJT 120. In some embodiments, at least one of the top gate of the JFET, the bottom gate of the JFET, the JFET gate 112, or the LVBJT gate 122 is connected to a direct current (DC) bias source.

Figure 2:
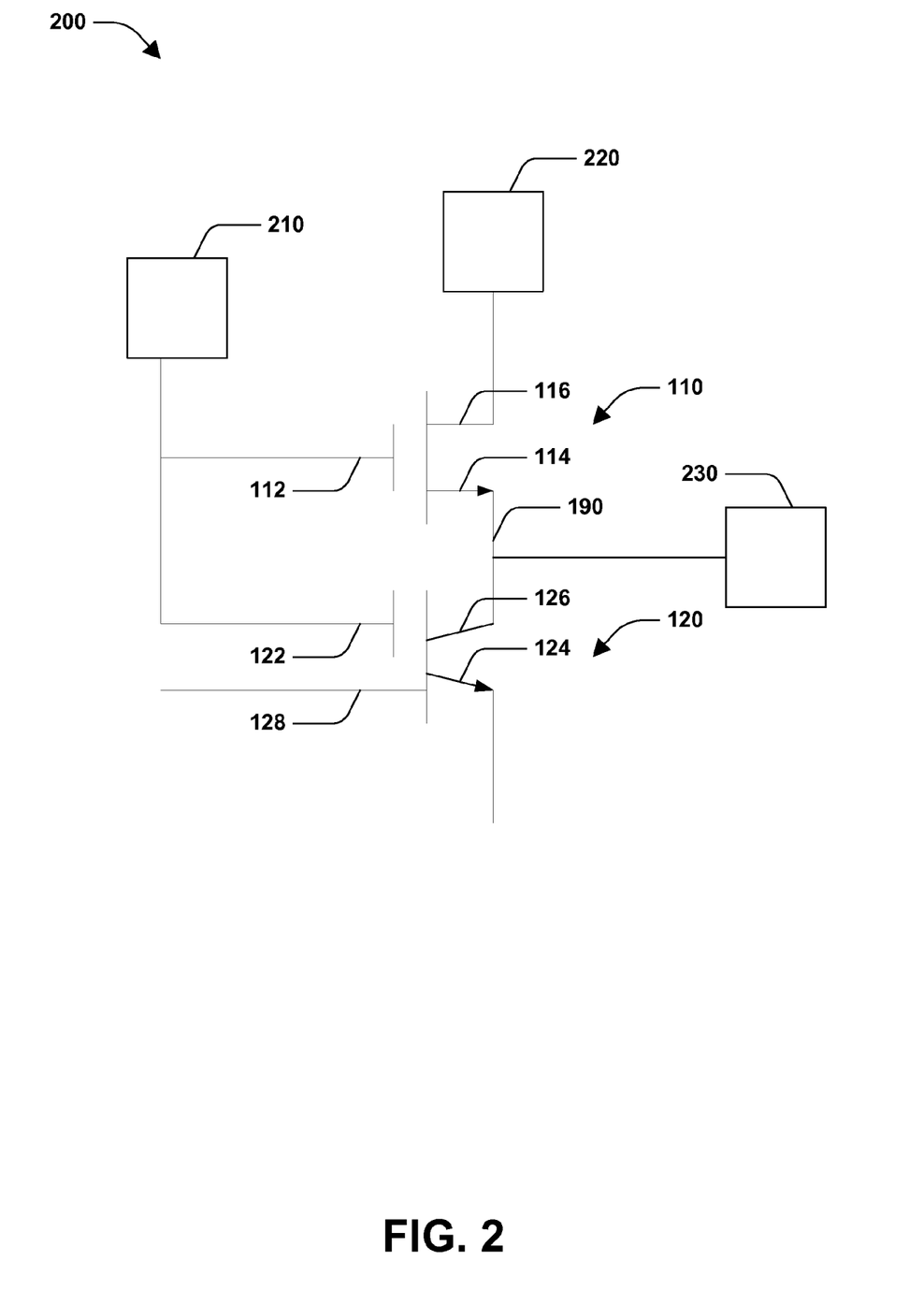
FIG. 2 is a schematic diagram of an example integrated circuit (IC), according to some embodiments.

FIG. 2 is a schematic diagram 200 of an example integrated circuit (IC), according to some embodiments. In some embodiments, the IC comprises at least one of a gate control circuit 210, an output matching circuit 220, or a common node control circuit 230. In some embodiments, the LVBJT gate 122 is connected to at least one of the gate control circuit 210 or at least one of the JFET gates. In some embodiments, the gate control circuit 210 is configured to control one or more signals associated with at least one of the JFET gate 112 or the LVBJT gate 122. For example, the LVBJT gate 122 is connected to at least one of the JFET gate 112, the top gate of the JFET 110, or the bottom gate of the JFET 110. In some embodiments, the JFET drain 116 is connected to the output matching circuit 220. In some embodiments, the LVBJT collector 126 is connected to at least one of the common node control circuit 230 or the JFET source 114. Similarly, the JFET source 114 is connected to at least one of the LVBJT collector 126 or the common node control circuit 230. In some embodiments, the common node control circuit 230 is configured to compensate for one or more capacitances associated with the IC, for example.

Figure 3:
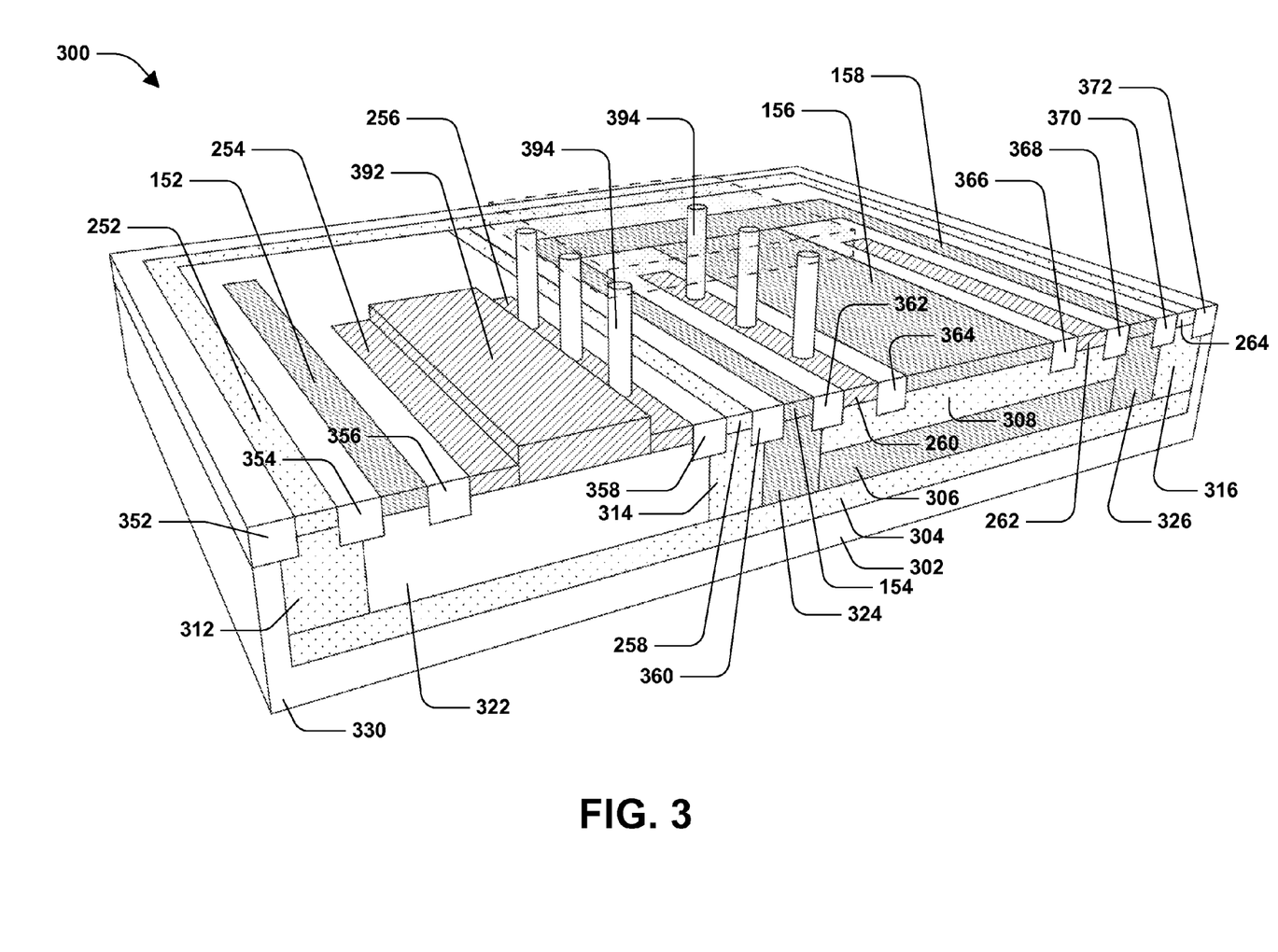
FIG. 3 is a perspective view of a cross-section of an example integrated circuit (IC) structure, according to some embodiments.

FIG. 3 is a perspective view 300 of a cross-section of an example integrated circuit (IC) structure, according to some embodiments. In some embodiments, a first-type region 330 is formed. In some embodiments, the first type is p-type. Accordingly, the first-type region 330 is a p-type region in some embodiments. In some embodiments, the first-type region 330 is a silicon substrate. In other embodiments, the first-type region 330 is formed above a silicon on insulator (SOI) region (not shown). In some embodiments, a second-type deep well region 304 is formed within the first-type region 330. For example, the second-type deep well region 304 is a deep n-well region formed within the first-type region 330. In some embodiments, a junction gate field effect transistor (JFET) and a lateral vertical bipolar junction transistor (LVBJT) are formed within the first-type region 330. In this way, the JFET and the LVBJT are formed within the same first-type region 330. In some embodiments, the JFET and the LVBJT are formed adjacent to one another. In some embodiments, the LVBJT is formed above at least a portion of the second-type deep well region 304. In some embodiments, the LVBJT is associated with at least one of a first second-type well region 312, a second second-type well region 314, and a first first-type well region 322. In some embodiments, the first second-type well region 312 is a first n-well, the second second-type well region 314 is a second n-well, and the first first-type well region 322 is a p-well. In some embodiments, at least some of at least one of the first second-type well region 312, second second-type well region 314, or the first first-type well region 322 is formed above at least some of the second-type deep well region 304. In some embodiments, the first first-type well region 322 is formed between the first second-type well region 312 and the second second-type well region 314. In some embodiments, at least one of a first shallow trench isolation (STI) region 352, a first second-type plus region 252, or a second STI region 354 is formed above at least some of the first second-type well region 312. In some embodiments, at least one of the second STI region 354, a first first-type plus region 152, a third STI region 356, a second second-type plus region 254, a gate region 392, a third second-type plus region 256, or a fourth STI region 358 is formed above at least some of the first first-type well region 322. In some embodiments, at least one of the fourth STI region 358, a fourth second-type plus region 258, or a fifth STI region 360 is formed above at least some of the second second-type well region 314. In some embodiments, the LVBJT is associated with at least one of the first shallow trench isolation (STI) region 352, the first second-type plus region 252, the second STI region 354, the first first-type plus region 152, the third STI region 356, the second second-type plus region 254, the gate region 392, the third second-type plus region 256, the fourth STI region 358, the fourth second-type plus region 258, or the fifth STI region 360. In some embodiments, the first second-type plus region 252 is a first N+ region, the first first-type plus region 152 is a first P+ region, the second second-type plus region 254 is a second N+ region, the gate region 392 comprises polysilicon, the third second-type plus region 256 is a third N+ region, and the fourth second-type plus region 258 is a fourth N+ region. In some embodiments, the LVBJT comprises an oxide region between the gate region 392 and the first first-type well region 322. In some embodiments, the first first-type plus region 152 is associated with a base of the LVBJT. In some embodiments, the third second-type plus region 256 is associated with a collector of the LVBJT. In some embodiments, the second second-type plus region 254 is associated with an emitter of the LVBJT. In some embodiments, the first second-type plus region 252 is between the first shallow trench isolation (STI) region 352 and the second STI region 354. Additionally, the second STI region 354 is between the first second-type plus region 252 and the first first-type plus region 152. Additionally, the first first-type plus region 152 is between the second STI region 354 and the third STI region 356. Additionally, the third STI region 356 is between the first first-type plus region 152 and the second second-type plus region 254. Additionally, the second second-type plus region 254 is between the third STI region 356 and the gate region 392. Additionally, the gate region 392 is between the second second-type plus region 254 and the third second-type plus region 256. Additionally, the third second-type plus region 256 is between the gate region 392 and the fourth STI region 358. Additionally, the fourth STI region 358 is between the third second-type plus region 256 and the fourth second-type plus region 258. Additionally, the fourth second-type plus region 258 is between the fourth STI region 358 and the fifth STI region 360.

In some embodiments, the JFET is formed above at least a portion of the second-type deep well region 304. In some embodiments, the JFET is associated with at least one of a second first-type well region 324, or a third first-type well region 326. In some embodiments, the JFET is associated with at least one of a second second-type well region 314 or a third second-type well region 316. In some embodiments, the second second-type well region 314 is a second n-well, the third second-type well region 316 is a third n-well, the second first-type well region 324 is a second p-well, and the third first-type well region 326 is a third p-well. In some embodiments, at least some of at least one of the second second-type well region 314, the third second-type well region 316, the second first-type well region 324, or the third first-type well region 326 is formed above at least some of the second-type deep well region 304. In some embodiments, the JFET is associated with a first-type bottom gate region 306 formed above at least some of the second-type deep well region 304. In some embodiments, the JFET is associated with a second-type channel region 308 formed above at least some of the first-type bottom gate region 306. In some embodiments, the first-type bottom gate region 306 is a p-type gate and the second-type channel region 308 is an n-channel for the JFET. In some embodiments, the second first-type well region 324 is formed between the second second-type well region 314 and at least one of the first-type bottom gate region 306 or the second-type channel region 308. In some embodiments, at least one of the first-type bottom gate region 306 or the second-type channel region 308 is formed between the second first-type well region 324 and the third first-type well region 326. In some embodiments, the third first-type well region 326 is formed between the third second-type well region 316 and at least one of the first-type bottom gate region 306 or the second-type channel region 308. In some embodiments, at least some of at least one of a fourth STI region 358, a fifth STI region 360, or a fourth second-type plus region 258 is formed above at least some of the second second-type well region 314. In some embodiments, at least some of at least one of the fifth STI region 360, a sixth STI region 362, or a second first-type plus region 154 is formed above at least some of the second first-type well region 324. In some embodiments, at least some of at least one of the sixth STI region 362, a seventh STI region 364, an eighth STI region 366, a ninth STI region 368, a fifth second-type plus region 260, a sixth second-type plus region 262, or a third first-type plus region 156 is formed above at least some of the second-type channel region 308. In some embodiments, at least some of at least one of the ninth STI region 368, a tenth STI region 370, or a fourth first-type plus region 158 is formed above at least some of the third first-type well region 326. In some embodiments, at least some of at least one of the tenth STI region 370, an eleventh STI region 372, or a seventh second-type plus region 264 is formed above at least some of the third second-type well region 316. In some embodiments, the JFET is associated with at least one of the fourth STI region 358, the fourth second-type plus region 258, the fifth STI region 360, the second first-type plus region 154, the sixth STI region 362, the fifth second-type plus region 260, the seventh STI region 364, the third first-type plus region 156, the eighth STI region 366, the sixth second-type plus region 262, the ninth STI region 368, the fourth first-type plus region 158, the tenth STI region 370, the seventh second-type plus region 264, or the eleventh STI region 372. In some embodiments, the fourth second-type plus region 258 is a fourth N+ region, the second first-type plus region 154 is a second P+ region, the fifth second-type plus region 260 is a fifth N+ region, the third first-type plus region 156 is a third P+ region, the sixth second-type plus region 262 is a sixth N+ region, the fourth first-type plus region 158 is a fourth P+ region, and the seventh second-type plus region 264 is a seventh N+ region. In some embodiments, the fifth second-type plus region 260 is associated with a source of the JFET. In some embodiments, the sixth second-type plus region 262 is associated with a drain of the JFET. In some embodiments, the third first-type plus region 156 is associated with a top gate of the JFET. In some embodiments, the fourth first-type plus region 158 is associated with a bottom gate of the JFET. In some embodiments, the fourth second-type plus region 258 is formed between the fourth STI region 358 and the fifth STI region 360. Additionally, the fifth STI region 360 is formed between the fourth second-type plus region 258 and the second first-type plus region 154. Additionally, the second first-type plus region 154 is formed between the fifth STI region 360 and the sixth STI region 362. Additionally, the sixth STI region 362 is formed between the second first-type plus region 154 and the fifth second-type plus region 260. Additionally, the fifth second-type plus region 260 is formed between the sixth STI region 362 and the seventh STI region 364. Additionally, the seventh STI region 364 is formed between the fifth second-type plus region 260 and the third first-type plus region 156. Additionally, the third first-type plus region 156 is formed between the seventh STI region 364 and the eighth STI region 366. Additionally, the eighth STI region 366 is formed between the third first-type plus region 156 and the sixth second-type plus region 262. Additionally, the sixth second-type plus region 262 is formed between the eighth STI region 366 and the ninth STI region 368. Additionally, the ninth STI region 368 is formed between the sixth second-type plus region 262 and the fourth first-type plus region 158. Additionally, the fourth first-type plus region 158 is formed between the ninth STI region 368 and the tenth STI region 370. Additionally, the tenth STI region 370 is formed between the fourth first-type plus region 158 and the seventh second-type plus region 264. Additionally, the seventh second-type plus region 264 is formed between the tenth STI region 370 and the eleventh STI region 372.

In some embodiments, the IC comprises at least one of a cascade or cascode configuration. For example, in some embodiments, the LVBJT collector is connected to the JFET source. In other words, the third second-type plus region 256 associated with a collector of the LVBJT is connected to the fifth second-type plus region 260 associated with a source of the JFET. For example, the LVBJT collector is connected to the JFET source based on interconnects 394. In some embodiments, a conductor (drawn with dashed lines) connects the LVBJT collector and the JFET source. Additionally, in some embodiments, the JFET is fabricated within the first-type region 330 such that the JFET is adjacent to the LVBJT. In some embodiments, the JFET shares implementation features or components with the LVBJT. For example, in some embodiments, at least one of the second second-type well region 314 or the fourth second-type plus region 258 is shared by the JFET and LVBJT.

In some embodiments, one or more STI regions are connected to one or more other STI regions, thus forming a connected STI region, for example. In some embodiments, the second STI region 354 is connected to at least one of the third STI region 356 or the fourth STI region 358. In this way, the second STI region 354, the third STI region 356, and the fourth STI region 358 form a connected STI region associated with the LVBJT. In some embodiments, the first STI region 352 is connected to the eleventh STI region 372. In this way, the first STI region 352 and the eleventh STI region 372 form a connected STI region associated with the IC structure of FIG. 3, for example. In some embodiments, the fifth STI region 360 is connected to the tenth STI region 370. In this way, the fifth STI region 360 and the tenth STI region 370 form a first connected STI region associated with the LVBJT. In some embodiments, the seventh STI region 364 is connected to the sixth STI region 362. In this way, the seventh STI region 364 and the sixth STI region 362 form a second connected STI region associated with the LVBJT. In some embodiments, the ninth STI region 368 is connected to the eighth STI region 366. In this way, the ninth STI region 368 and the eighth STI region 366 form a third connected STI region associated with the LVBJT.

Similarly, one or more well regions are connected to one or more other well regions, thus forming a connected well region, for example. In some embodiments, the first second-type well region 312 is connected to at least one of the second second-type well region 314, or the third second-type well region 316. In this way, the first second-type well region 312, the second second-type well region 314, and the third second-type well region 316 form a connected second-type well region associated with the IC structure of FIG. 3, for example. In some embodiments, the second first-type well region 324 is connected to the third first-type well region 326. In this way, the second first-type well region 324 and the third first-type well region 326 form a connected first-type well region associated with the JFET. In some embodiments, the JFET is an nJFET.

Additionally, in some embodiments, one or more plus regions are connected to one or more other plus regions, thus forming a connected plus region, for example. For example, the second first-type plus region 154 is connected to the fourth first-type plus region 158. In this way, the second first-type plus region 154 and the fourth first-type plus region 158 form a connected first-type plus region associated with the LVBJT.

It will be appreciated that, respective features are associated with different dimensions, according to some embodiments. For example, the gate region 392 is associated with at least one of a gate width or gate length different from at least one of a gate width or gate length of the first-type bottom gate region 306. For another example, the first shallow trench isolation (STI) region 352 is associated with one or more dimensions such that respective dimensions of the first STI region 352 are different from one or more dimensions of the second STI region 354, according to some embodiments.

The following figures illustrate formation of an example integrated circuit (IC) structure during semiconductor fabrication, according to some embodiments. It will be appreciated that the respective figures are described with reference to one another, such as with reference to a previous figure, for example.

Figure 4:
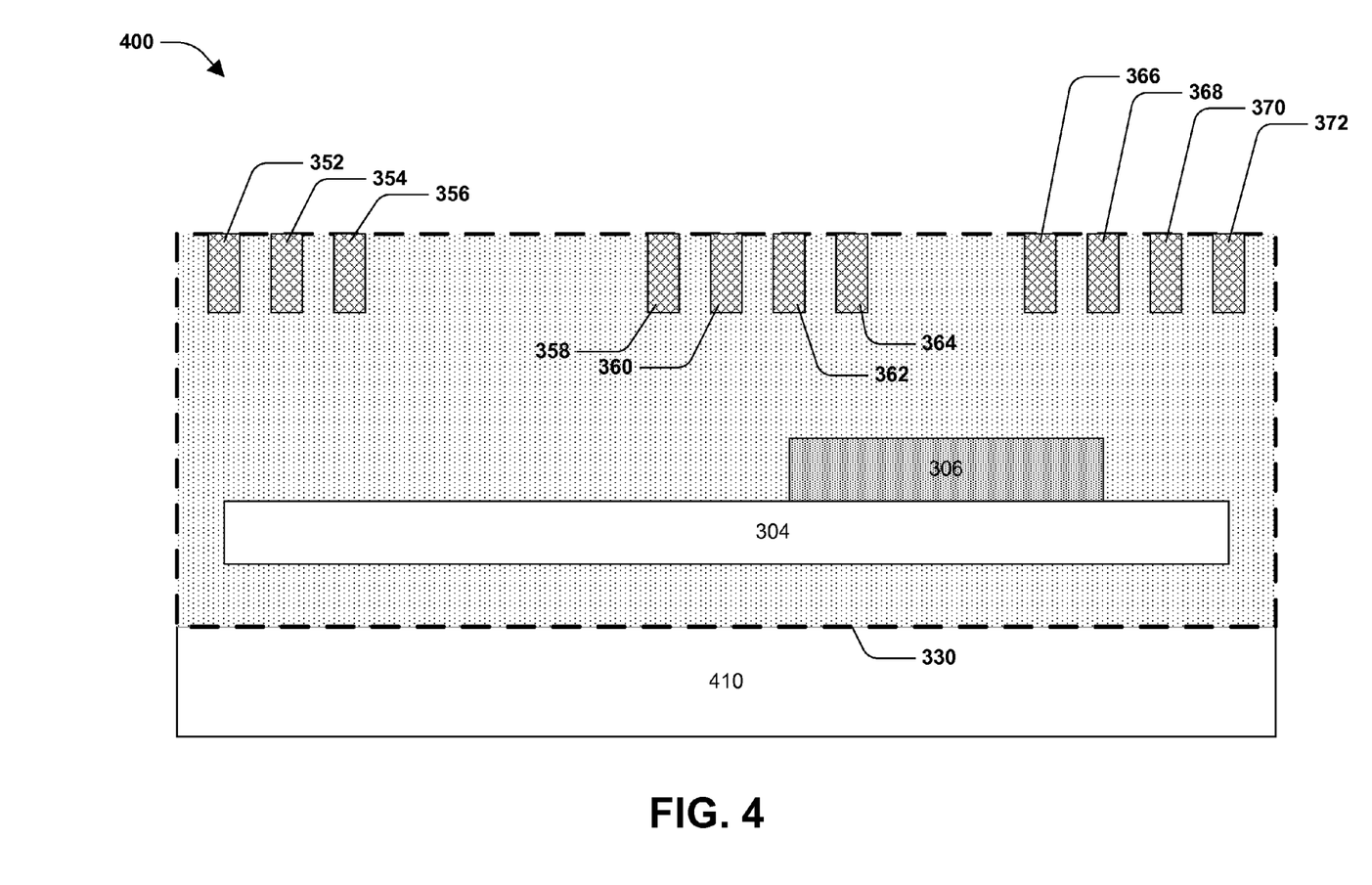
FIG. 4 is a cross-sectional view of an example integrated circuit (IC) structure during formation, according to some embodiments.

Accordingly, FIG. 4 is a cross-sectional view 400 of an example integrated circuit (IC) structure during formation, according to some embodiments. For example, in some embodiments, a first-type region 330 is formed. In some embodiments, the first-type region 330 is a substrate. For example, the first-type region 330 comprises a silicon substrate in some embodiments. In some embodiments, the first-type region 330 is formed above at least some of a silicon on insulator (SOI) region 410. In some embodiments, the SOI region 410 is a substrate region. In some embodiments, the SOI region 410 is under the first-type region 330. In some embodiments, the first-type region 330 is a p-type region. In some embodiments, a second-type deep well region 304 is formed within the first-type region 330. For example, the second-type deep well region 304 is a deep n-well, according to some embodiments. In some embodiments, a first-type bottom gate region 306 is formed above at least some of the second-type deep well region 304. In some embodiments, the first-type bottom gate region 306 is a p-type region. In some embodiments, one or more shallow trench isolation (STI) regions are formed. For example, at least one of a first STI region 352, a second STI region 354, a third STI region 356, a fourth STI region 358, a fifth STI region 360, a sixth STI region 362, a seventh STI region 364, an eighth STI region 366, a ninth STI region 368, a tenth STI region 370, or an eleventh STI region 372 is formed. In some embodiments, at least one of the STI regions is formed at a surface of the first-type region 330 or flush with the surface of the first-type region 330. In some embodiments, at least one of the STI regions comprises a dielectric or is formed based on chemical mechanical planarization (CMP).

Figure 5:
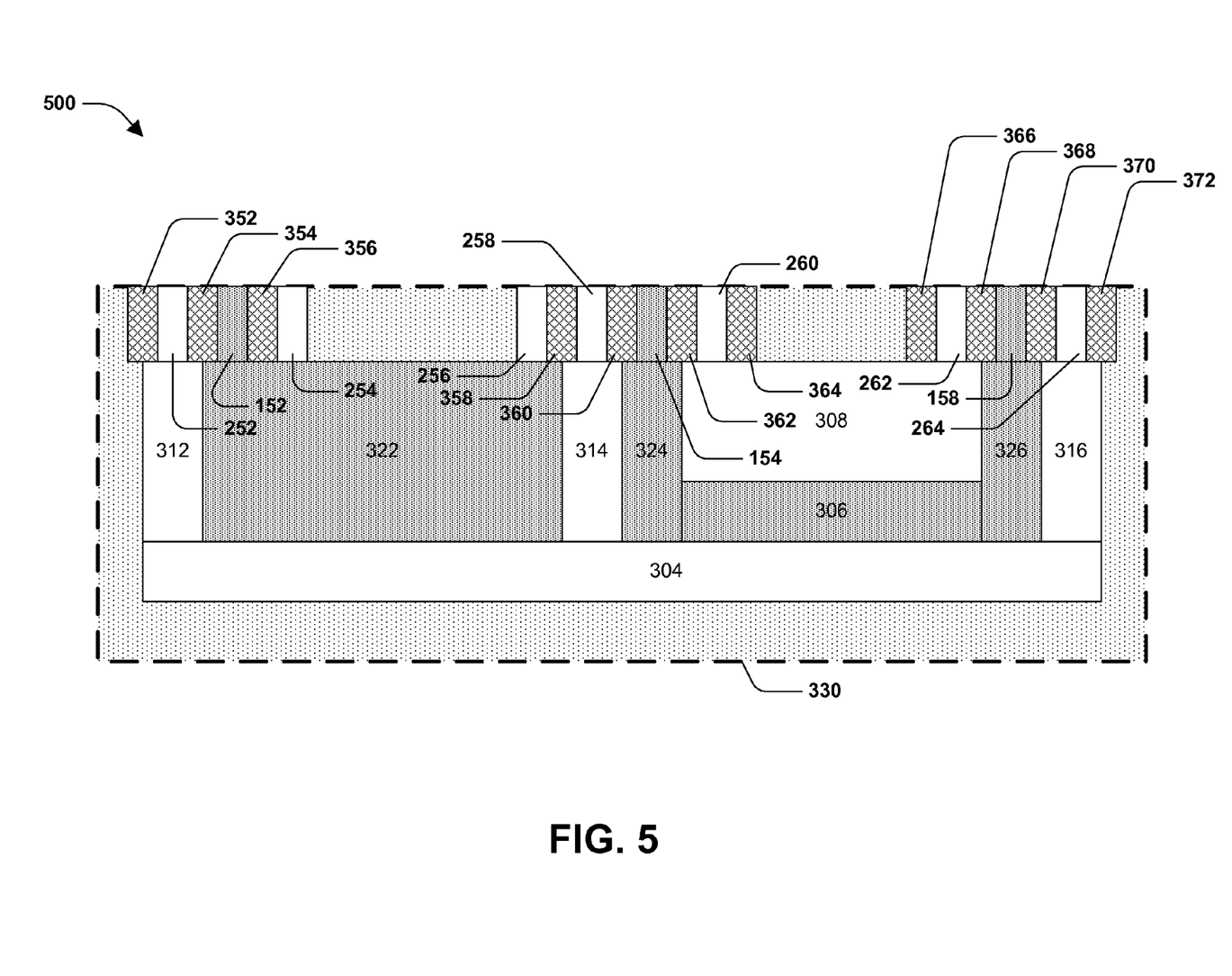
FIG. 5 is a cross-sectional view of an example integrated circuit (IC) structure during formation, according to some embodiments.

FIG. 5 is a cross-sectional view 500 of an example integrated circuit (IC) structure during formation, according to some embodiments. For example, one or more first-type well regions are formed. Similarly, one or more second-type well regions are formed. Additionally, at least some of a second-type channel region 308 is formed above at least some of a first-type bottom gate region 306. In some embodiments, at least one of a first second-type well region 312, second second-type well region 314, or third second-type well region 316 is formed above at least some of the second-type deep well region 304. In some embodiments, at least one of a first first-type well region 322, second first-type well region 324, or third first-type well region 326 is formed above at least some of the second-type deep well region 304. In some embodiments, the first second-type well region 312 is adjacent to the first first-type well region 322, adjacent to the second second-type well region 314, adjacent to the second first-type well region 324, adjacent to at least one of the first-type bottom gate region 306 or the second-type channel region 308, adjacent to the third first-type well region 326, adjacent to the third second-type well region 316. In some embodiments, at least one of one or more STI regions, first-type plus regions, or second-type plus regions are formed at a surface of the first-type plus region 330 or flush with the surface of the first-type plus region 330. In some embodiments, at least some of at least one of the first STI region 352, the second STI region 354, or a first second-type plus region 252 is formed above at least some of the first second-type well region 312. In some embodiments, at least some of at least one of the second STI region 354, third STI region 356, fourth STI region 358, first first-type plus region 152, second second-type plus region 254, or third second-type plus region 256 is formed above at least some of the first first-type well region 322. In some embodiments, at least some of at least one of the fourth STI region 358, fifth STI region 360, or fourth second-type plus region 258 is formed above at least some of the second second-type well region 314. In some embodiments, at least some of at least one of the fifth STI region 260, the sixth STI region 262, or the second first-type plus region 154 is formed above at least some of the second first-type well region 324. In some embodiments, at least some of at least one of the sixth STI region 362, the seventh STI region 364, the eighth STI region 366, the ninth STI region 368, the fifth second-type plus region 260, or the sixth second-type plus region 262 is formed above at least some of the second-type channel region 308. In some embodiments, at least some of at least one of the ninth STI region 368, the tenth STI region 370, or the fourth second-type region 158 is formed above at least some of the third first-type well region 326. In some embodiments, at least some of at least one of the tenth STI region 370, the eleventh STI region 372, or the seventh second-type plus region 264 is formed above at least some of the third second-type well region 316. In some embodiments, the first shallow trench isolation (STI) region 352 is adjacent to the first second-type plus region 252, adjacent to the second STI region 354, adjacent to the first first-type plus region 152, adjacent to the third STI region 356, adjacent to the second second-type plus region 254, adjacent to the gate region 392, adjacent to the third second-type plus region 256, adjacent to the fourth STI region 358, adjacent to the fourth second-type plus region 258, adjacent to the fifth STI region 360, adjacent to the second first-type plus region 154, adjacent to the sixth STI region 362, adjacent to the fifth second-type plus region 260, adjacent to the seventh STI region 364, adjacent to the third first-type plus region 156, adjacent to the eighth STI region 366, adjacent to the sixth second-type plus region 262, adjacent to the ninth STI region 368, adjacent to the fourth first-type plus region 158, adjacent to the tenth STI region 370, adjacent to the seventh second-type plus region 264, adjacent to the eleventh STI region 372.

Figure 6:
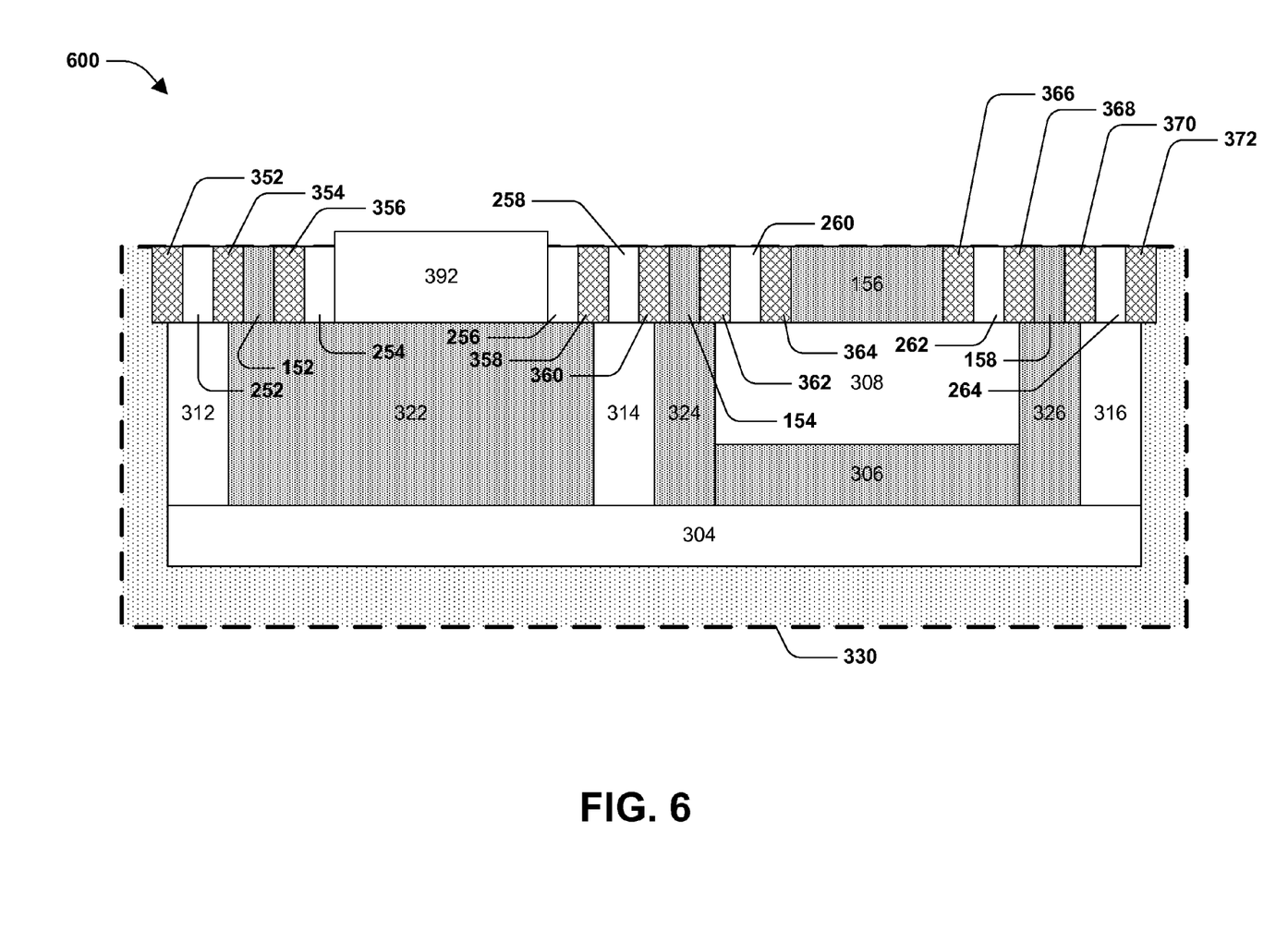
FIG. 6 is a cross-sectional view of an example integrated circuit (IC) structure during formation, according to some embodiments.

FIG. 6 is a cross-sectional view 600 of an example integrated circuit (IC) structure during formation, according to some embodiments. In some embodiments, a gate region 392 is formed above at least some of the first first-type well region 322. In some embodiments, an oxide region (not shown) is formed between the gate region 392 and the first first-type well region 322. In some embodiments, a third first-type plus region 156 is formed above at least some of the second-type channel region 308.

FIG. 7 is a cross-sectional view 700 of an example integrated circuit (IC) structure during formation, according to some embodiments. In some embodiments, a JFET region 310 and a LVBJT region 320 are formed within the first-type region 330. In some embodiments, the JFET region 310 is associated with a JFET and the LVBJT region 320 is associated with a LVBJT. It will be appreciated that in some embodiments, the JFET region 310 overlaps the LVBJT region 320, at least because the JFET region 310 shares one or more features or components with the LVBJT region 320 in some embodiments. In some embodiments, one or more interconnects 394 is configured to connect a collector of the LVBJT to a source of the JFET. For example, the third second-type plus region 256 is associated with a collector of the LVBJT. For another example, the fifth second-type plus region 260 is associated with a source of the JFET. Additionally, 390 is configured to connect at least some of the JFET to at least some of the LVBJT. In some embodiments, the IC comprises at least one of a cascade or cascode configuration, at least because the source of the JFET is connected to a collector of the LVBJT or at least because the fifth second-type plus region 260 is connected to the third second-type plus region 256. In some embodiments, the JFET and the LVBJT share at least one of a feature, component, or region. For example, in some embodiments, the JFET and LVBJT share one or more plus regions or one or more well regions. For example, the JFET shares an n plus region with the LVBJT in some embodiments. In some embodiments, the JFET associated with the JFET region 310 is an n-channel JFET.

It will be appreciated that, respective features are associated with different dimensions, according to some embodiments. For example, the JFET region 310 is associated with a different length than the LVBJT region 320, in some embodiments. Accordingly, the JFET and LVBJT of FIG. 7 are associated with different dimensions, according to some aspects. In this way, the IC structure for power amplification is formed such that the IC structure is associated with higher gain, higher linearity, higher breakdown voltage, and a lower flicker noise based on a CMOS process, for example. For example, the IC structure of FIG. 7 is associated with a high integration with silicon and is configured to mitigate reliability issues at least because the JFET and LVBJT are formed within the same region or same substrate.

Figure 8:
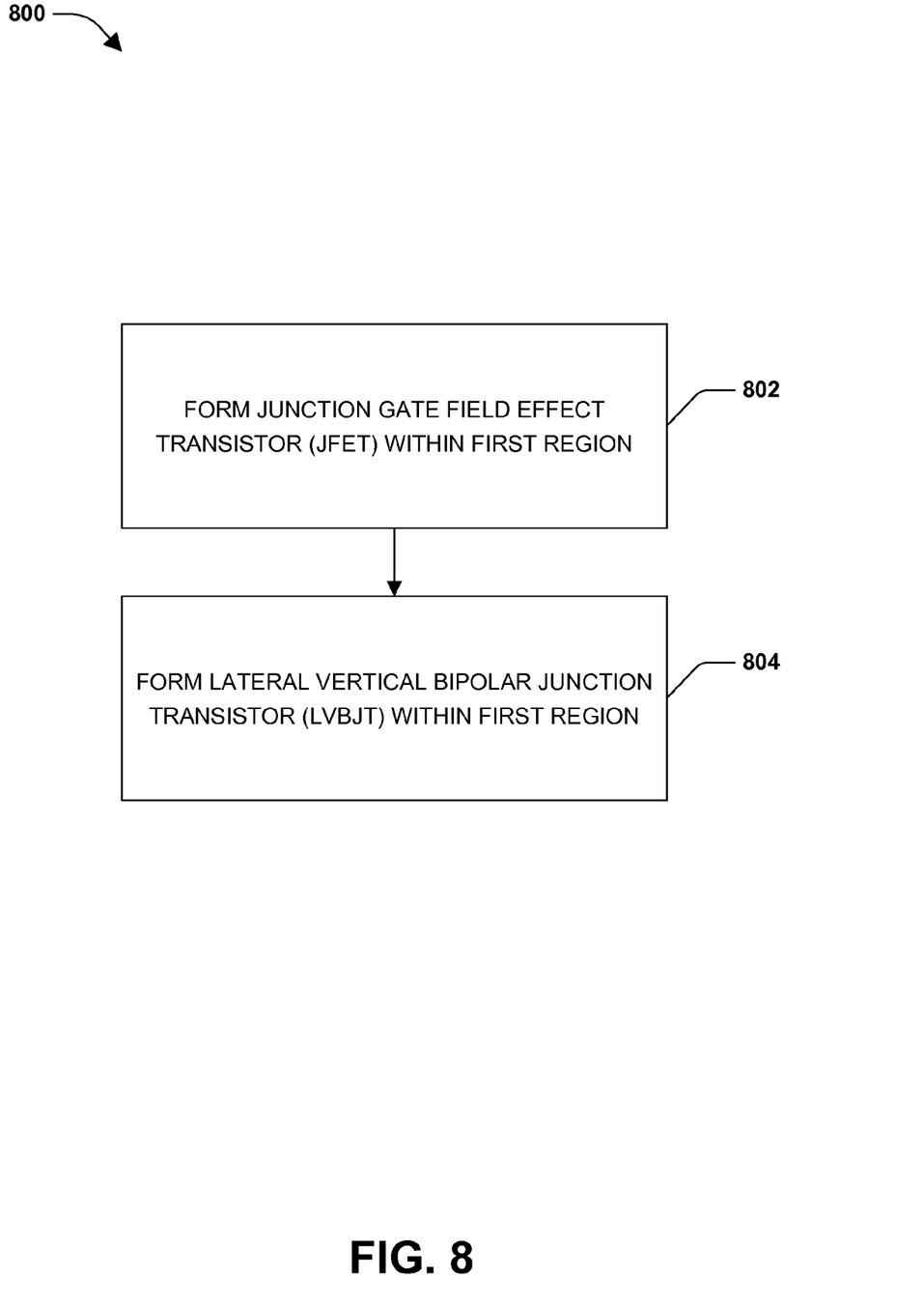
FIG. 8 is a flow diagram of an example method for forming an integrated circuit (IC) structure, according to some embodiments.

FIG. 8 is a flow diagram of an example method 800 for forming an integrated circuit (IC) structure, according to some embodiments. For example, the method 800 comprises forming a junction gate field effect transistor (JFET) within a first region at 802. At 804, a lateral vertical bipolar junction transistor (LVBJT) is formed within the first region. For example, the LVBJT is formed within the first-type region such that a LVBJT collector of the LVBJT is connected to a JFET source of the JFET. For example, the LVBJT is formed within the first-type region such that the LVBJT is adjacent to the JFET. In some embodiments, the first region is a first-type region. In some embodiments, the JFET and the LVBJT are formed within a same region, such as a same substrate region. In some embodiments, the JFET and LVBJT are implemented as separate components on the same substrate. It will be appreciated that features or components of the JFET and LVBJT are associated with different dimensions in some embodiments. In some embodiments, the JFET and LVBJT are formed concurrently. In some embodiments, a silicon on insulator (SOI) substrate region is formed. In other embodiments, a silicon substrate is formed. In some embodiments, the substrate is a first-type region. In some embodiments, a second-type deep well region is formed within the substrate or the first-type region. In some embodiments, the method comprises forming a bottom gate region and a channel region. For example, the bottom gate region is a first-type bottom gate region and the channel region is a second-type channel region. In some embodiments, the bottom gate region and the channel region are formed within the JFET. In some embodiments, the method 800 comprises forming one or more well regions. For example, one or more first-type well regions and one or more second-type well regions are formed within at least one of the JFET or LVBJT. In some embodiments, one or more complementary metal-oxide semiconductor (CMOS) process flows are utilized to facilitate fabrication of the IC or IC structure. For example, processing, such as CMOS processing, associated with oxide, polysilicon, spacer deposition, halo implantation, etc. is used to fabricate the IC or IC structure, according to some aspects. In some embodiments, at least one of a source enhanced region, drain enhanced region, source, drain, resist protective oxide (RPO), one or more junctions, etc. are formed.

According to some aspects, an integrated circuit (IC) is provided, comprising a junction gate field effect transistor (JFET) and a lateral vertical bipolar junction transistor (LVBJT). In some embodiments, the JFET comprises one or more JFET gates, a JFET source, and a JFET drain. In some embodiments, the LVBJT comprises one or more LVBJT gates, a LVBJT base, a LVBJT emitter, and a LVBJT collector. In some embodiments, at least one of the LVBJT gates is connected to at least one of a gate control circuit or at least one of the JFET gates. In some embodiments, the LVBJT collector is connected to at least one of a common node control circuit or the JFET source.

According to some aspects, an integrated circuit (IC) structure is provided, comprising a first-type region. In some embodiments, the first-type region comprises a lateral vertical bipolar junction transistor (LVBJT) region within at least some of the first-type region and a junction gate field effect transistor (JFET) region within at least some of the first-type region. In some embodiments, the LVBJT region comprises at least a portion of a second-type deep well region, a first second-type well region, a second second-type well region, and a first first-type well region between the first second-type well region and the second second-type well region. In some embodiments, the LVBJT region comprises a first shallow trench isolation (STI) region above at least some of the first second-type well region, a second STI region above at least some of at least one of the first second-type well region or the first first-type well region, a third STI region above at least some of the first first-type well region, a fourth STI region above at least some of at least one of the first first-type well region or the second second-type well region, and a fifth STI region above at least some of the second second-type well region. In some embodiments, the LVBJT region comprises a first second-type plus region, a first first-type plus region, a second second-type plus region, a gate region, a third second-type plus region, and a fourth second-type plus region. In some embodiments, the first second-type plus region is at least one of above the first second-type well region or between the first STI region and the second STI region. In some embodiments, the first first-type plus region is at least one of above the first first-type well region or between the second STI region and the third STI region. In some embodiments, the second second-type plus region is above the first first-type well region. In some embodiments, the gate region is above the first first-type well region. In some embodiments, the third second-type plus region is above the first first-type well region. In some embodiments, the fourth second-type plus region is at least one of above the second second-type well region or between the fourth STI region and the fifth STI region. In some embodiments, the JFET region comprises at least a portion of the second-type deep well region, a third second-type well region above the second-type deep well region, a second first-type well region above the second-type deep well region, and a third first-type well region above the second-type deep well region. In some embodiments, the JFET region comprises a first-type bottom gate region and a second-type channel region. For example, the first-type bottom gate region is at least one of above the second-type deep well region or between the second first-type well region and the third first-type well region. For another example, the second-type channel region is at least one of above the first-type bottom gate region or between the second first-type well region and the third first-type well region. In some embodiments, the JFET region comprises the fifth STI region, a sixth STI region, a seventh STI region, an eighth STI region, a ninth STI region, a tenth STI region, and an eleventh STI region. For example, the fifth STI region is above at least some of at least one of the second second-type well region or the second first-type region. For example, the sixth STI region is above at least some of at least one of the second first-type well region or the second-type channel region. For example, the seventh STI region is above at least some of the second-type channel region. For example, the eighth STI region is above at least some of the second-type channel region. For example, the ninth STI region is above at least some of at least one of the second-type channel region or the third first-type well region. For example, the tenth STI region is above at least some of at least one of the third first-type well region or the third second-type well region. For example, the eleventh STI region is above at least some of the third second-type well region. In some embodiments, the JFET region comprises a second first-type plus region, a third first-type plus region, a fourth first-type plus region, a fifth second-type plus region, a sixth second-type plus region, and a seventh second-type plus region. For example, the second first-type plus region is above at least some of the second first-type well region. For example, the third first-type plus region is above at least some of the second-type channel region. For example, the fourth first-type plus region is above at least some of the third first-type well region. For example, the fifth second-type plus region at least one of above the second-type channel region, between the sixth STI region and the seventh STI region, or connected to the third second-type plus region. For example, the sixth second-type plus region is at least one of above the second-type channel region or between the eighth STI region and the ninth STI region. For example, the seventh second-type plus region is above the third second-type well region.

According to some aspects, method for forming an integrated circuit (IC) structure is provided, comprising forming a junction gate field effect transistor (JFET) within a first-type region. In some embodiments, the method comprises forming a lateral vertical bipolar junction transistor (LVBJT) within the first-type region. For example, the LVBJT is formed within the first-type region such that a LVBJT collector of the LVBJT is connected to a JFET source of the JFET. For another example, the LVBJT is formed within the first-type region such that the LVBJT is adjacent to the JFET.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated based on this description. Further, it will be understood that not all operations are necessarily present in each embodiment provided herein.

It will be appreciated that layers, features, regions, elements, such as the first-type region, second-type deep well region, one or more well regions, one or more shallow trench isolation (STI) regions, one or more plus regions, gate region, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, features, regions, elements, etc. mentioned herein, such as implanting techniques, etching techniques, doping techniques, spin-on techniques, such as spin coating, sputtering techniques such as magnetron or ion beam sputtering, growth techniques, such as thermal growth or deposition techniques such as chemical vapor deposition (CVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. An integrated circuit (IC), comprising:
 a junction gate field effect transistor (JFET) comprising:
  one or more JFET gates;
  a JFET source; and
  a JFET drain;
  a first-type well region; and
 a lateral vertical bipolar junction transistor (LVBJT) comprising:
  one or more LVBJT gates, at least one of the LVBJT gates connected to at least one of a gate control circuit or at least one of the JFET gates;
  a LVBJT base;
  a LVBJT emitter;
  a LVBJT collector, the LVBJT collector connected to at least one of a common node control circuit or the JFET source;
  a second first-type well region abutting the LVBJT base, the LVBJT emitter, and the LVBJT collector;
  a second-type well region abutting the first-type well region and the second first-type well region, the second-type well region doped with a different dopant than the first-type well region and the second first-type well region; and
  a second-type deep well region abutting the second first-type well region and the second-type well region.

2. The integrated circuit (IC) of claim 1, the JFET comprising at least one of a top gate or a bottom gate.

3. The integrated circuit (IC) of claim 1, at least one of the JFET gates connected to ground.

4. The integrated circuit (IC) of claim 1, at least one of the JFET gates connected to a direct current (DC) bias source.

5. The integrated circuit (IC) of claim 1, comprising an output matching circuit, the output matching circuit connected to the JFET drain.

6. An integrated circuit (IC) structure, comprising:
 a first-type region comprising:
  a lateral vertical bipolar junction transistor (LVBJT) region within at least some of the first-type region, the LVBJT region comprising:
   at least a portion of a second-type deep well region;
   a first second-type well region;
   a second second-type well region;
   a first first-type well region between the first second-type well region and the second second-type well region;
   a first shallow trench isolation (STI) region above at least some of the first second-type well region;
   a second STI region above at least some of at least one of the first second-type well region or the first first-type well region;
   a third STI region above at least some of the first first-type well region;
   a fourth STI region above at least some of at least one of the first first-type well region or the second second-type well region;
   a fifth STI region above at least some of the second second-type well region;
   a first second-type plus region at least one of:
    above the first second-type well region; or
    between the first STI region and the second STI region;
   a first first-type plus region at least one of:
    above the first first-type well region; or
    between the second STI region and the third STI region;
   a second second-type plus region above the first first-type well region;
   a gate region above the first first-type well region;
   a third second-type plus region above the first first-type well region; and
   a fourth second-type plus region at least one of:
    above the second second-type well region; or
    between the fourth STI region and the fifth STI region; and
  a junction gate field effect transistor (JFET) region within at least some of the first-type region, the JFET region comprising:
   at least a portion of the second-type deep well region;
   a third second-type well region above the second-type deep well region;
   a second first-type well region above the second-type deep well region;
   a third first-type well region above the second-type deep well region;
   a first-type bottom gate region at least one of:
    above the second-type deep well region; or
    between the second first-type well region and the third first-type well region;
   a second-type channel region at least one of:
    above the first-type bottom gate region; or
    between the second first-type well region and the third first-type well region;
   the fifth STI region above at least some of at least one of the second second-type well region or the second first-type region;
   a sixth STI region above at least some of at least one of the second first-type well region or the second-type channel region;
   a seventh STI region above at least some of the second-type channel region;
   an eighth STI region above at least some of the second-type channel region;
   a ninth STI region above at least some of at least one of the second-type channel region or the third first-type well region;
   a tenth STI region above at least some of at least one of the third first-type well region or the third second-type well region;
   an eleventh STI region above at least some of the third second-type well region;
   a second first-type plus region above at least some of the second first-type well region;
   a third first-type plus region above at least some of the second-type channel region;
   a fourth first-type plus region above at least some of the third first-type well region;
   a fifth second-type plus region at least one of:
    above the second-type channel region;
    between the sixth STI region and the seventh STI region; or
    connected to the third second-type plus region;
   a sixth second-type plus region at least one of:

above the second-type channel region; or
between the eighth STI region and the ninth STI region; and
a seventh second-type plus region above the third second-type well region.

7. The integrated circuit (IC) structure of claim 6, the second STI region connected to the third STI region and the fourth STI region.

8. The integrated circuit (IC) structure of claim 6, the first STI region connected to the eleventh STI region.

9. The integrated circuit (IC) structure of claim 6, the fifth STI region connected to the tenth STI region.

10. The integrated circuit (IC) structure of claim 6, the ninth STI region connected to the eighth STI region.

11. The integrated circuit (IC) structure of claim 6, the seventh STI region connected to the sixth STI region.

12. The integrated circuit (IC) structure of claim 6, the first second-type well region connected to the second second-type well region and the third second-type well region.

13. The integrated circuit (IC) structure of claim 6, the second first-type well region connected to the third first-type well region.

14. The integrated circuit (IC) structure of claim 6, the second second-type plus region associated with an emitter.

15. The integrated circuit (IC) structure of claim 6, the third second-type plus region associated with a collector.

16. The integrated circuit (IC) structure of claim 6, the first first-type plus region associated with a base.

17. The integrated circuit (IC) structure of claim 6, comprising an oxide region between the gate region and the first first-type well region.

18. The integrated circuit (IC) structure of claim 6, comprising a silicon on insulator (SOI) region under the first-type region.

19. The integrated circuit (IC) structure of claim 6, the first-type is p-type and the second-type is n-type.

20. An integrated circuit (IC), comprising:
a junction gate field effect transistor (JFET) comprising:
one or more JFET gates;
a JFET source; and
a JFET drain;
a first-type well region;
a first-type plus region above the first-type well region; and
a lateral vertical bipolar junction transistor (LVBJT) comprising:
one or more LVBJT gates, at least one of the LVBJT gates connected to at least one of a gate control circuit or at least one of the JFET gates;
a LVBJT base;
a LVBJT emitter;
a LVBJT collector, the LVBJT collector connected to at least one of a common node control circuit or the JFET source;
a second-type well region abutting the first-type well region; and
a second-type plus region above the second-type well region, a shallow trench isolation region disposed between the second-type plus region and the first-type plus region.

* * * * *